(12) United States Patent
Miyamoto et al.

(10) Patent No.: US 7,889,908 B2
(45) Date of Patent: Feb. 15, 2011

(54) METHOD AND APPARATUS FOR MEASURING SHAPE OF A SPECIMEN

(75) Inventors: Atsushi Miyamoto, Yokohama (JP); Maki Tanaka, Yokohama (JP); Hidetoshi Morokuma, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1058 days.

(21) Appl. No.: 11/335,515

(22) Filed: Jan. 20, 2006

(65) Prior Publication Data
US 2006/0210143 A1   Sep. 21, 2006

(30) Foreign Application Priority Data
Mar. 16, 2005   (JP)  ............... 2005-074249

(51) Int. Cl.
G06K 9/00 (2006.01)
A61N 5/00 (2006.01)
G06G 5/00 (2006.01)

(52) U.S. Cl. .................... 382/145; 382/154; 250/492.2; 250/492.3

(58) Field of Classification Search ......... 382/141–151; 356/237.5, 237.6, 237.1, 237.2, 237.3, 237.4; 250/491.1, 492.2, 492.22
See application file for complete search history.

(56) References Cited

U.S. PATENT DOCUMENTS 5,680,471 A * 10/1997 Kanebako et al. .......... 382/128
6,249,597 B1 * 6/2001 Tsudaka ................. 382/144
6,486,492 B1 * 11/2002 Su .......................... 257/48

(Continued)

FOREIGN PATENT DOCUMENTS

JP   05-181980   7/1993

(Continued)

OTHER PUBLICATIONS

Price, J., Bingham, P., Tobin, K., and Karnowski, T., "Semiconductor Sidewall Shape Estimation using Top-Down CD-SEM Image Retrieval," Proceedings of the 6th International Conference on Quality Control by Artificial Vision, SPIE vol. 5132, pp. 209-219, Apr. 2003.*

Primary Examiner—Vu Le
Assistant Examiner—Andrae S Allison
(74) Attorney, Agent, or Firm—Antonelli, Terry, Stout & Kraus, LLP.

(57) ABSTRACT

In the past, when a shape was corrected by adjusting parameters of a shape calculating equation proper for a measuring method used in measuring a two-dimensional or three-dimensional shape by correlating the parameters and a shape index value, the degree of freedom of modifying a shape by correction depended on a model equation used in the calculation of the shape, and therefore such a shape correction method was unsuitable for objects of correction having a number of shape variations. According to the present invention, the three-dimensional shape is corrected by fitting a curvature equation to a three-dimensional shape of a semiconductor pattern measured by any three-dimensional shape measuring method and by adjusting parameters of the curvature equation based on a shape index value separately calculated. The relations between the shape index value and the parameters are stored in a data base, and at the time of measurement the measured shapes are corrected based on the relations mentioned above.

9 Claims, 10 Drawing Sheets

U.S. PATENT DOCUMENTS

| | | | |
|---|---|---|---|
| 6,868,175 B1 * | 3/2005 | Yamamoto et al. | 382/145 |
| 7,062,396 B2 * | 6/2006 | Ogawa | 702/85 |
| 7,209,857 B2 * | 4/2007 | Sato et al. | 702/155 |
| 7,449,689 B2 * | 11/2008 | Nagatomo et al. | 250/310 |
| 7,483,560 B2 * | 1/2009 | Shishido et al. | 382/145 |
| 2002/0194576 A1 * | 12/2002 | Toyama | 716/21 |

FOREIGN PATENT DOCUMENTS

| | | |
|---|---|---|
| JP | 2000-146558 | 5/2000 |
| JP | 2000-348658 | 12/2000 |
| JP | 2003-315029 | 11/2003 |

* cited by examiner (a)

(b)

(c)

(a)

(b)

(c)

METHOD AND APPARATUS FOR MEASURING SHAPE OF A SPECIMEN

BACKGROUND OF THE INVENTION

The present invention relates to a method and apparatus for measuring the shape of a specimen by using the signals emitted from the specimen as a result of exposure of the specimen to electromagnetic wave or electrically charged particles and a method of estimating the features of a semiconductor device from the value or changes in the value of shape parameters acquired by measuring or a method of estimating or monitoring the state of the semiconductor production process.

For forming a line pattern on a semiconductor wafer, the method of coating the semiconductor wafer with a coating material called resist, covering the resist with a mask on which a line pattern is formed, irradiating the masked semiconductor wafer with a visible ray, ultraviolet ray or electronic beam for exposing the resist to the rays is adopted. Due to changes in the tilt angle and the shape of the sloping part of the line pattern thus acquired depending on the density and focusing of the visible ray, ultraviolet ray or electronic beams applied, in order to form a high-precision line pattern, it is necessary to measure and examine the three-dimensional shape of the pattern. For this examination, the sectional shape can be measured precisely by cutting the wafer and by measuring the sectional shape. However, this process requires manpower and costs. For this reason, a non-destructive and noncontact method of measuring the sectional shape of patterns by means of scanning electron microscopy (hereinafter referred to as "SEM") is proposed.

As a method of acquiring tilt images where in the object of measurement is observed from any freely chosen tilt angle by means of SEM, there is for example a method of deflecting the electronic beams applied by the electro-optical system, and tilting the irradiation angle of the electronic beams to pick up tilt images as shown in the Japanese Patent Application Laid Open 2000-348658. And as a method for measuring the sectional shape of the object, there is for example a method of measuring sectional shape combining the shape from shading method using the tilt images as shown in the Japanese Patent Application Laid Open 2003-315029 and the Japanese Patent Application Laid Open 2000-146558 and the stereo-matching method. This method detects the characteristic points of the signal wave form detected by the secondary electron detector of SEM, measure the absolute value of the height of the section by stereo matching of the characteristic points, and calculates the shape between characteristic points based on the shape from shading method.

And the Japanese Patent Application Laid Open 1993-181980 discloses a method of detecting edges from two-dimensional luminance image data, calculating an index value showing the smoothness of the surface of the object of measurement from the edges, and restoring the three-dimensional shape of the object of measurement by using this index value as a means of restoring a correct three-dimensional shape in response to abrupt changes in the surface of the object of measurement.

Relating to the two-dimensional or three-dimensional shape of semiconductor patterns measured by any freely chosen two-dimensional or three-dimensional shape measurement method, the present invention relates to a method of reforming a two-dimensional or three-dimensional shape of a higher precision by correcting the measured points for which a high precision could not be achieved only by the freely chosen two-dimensional or three-dimensional shape measurement method based on the image feature value (hereinafter referred as "shape index value") related with the two-dimensional or three-dimensional shape.

In the past, it was difficult to easily correlate two-dimensional or three dimensional shapes with shape index values. For example, according to the method described in the Japanese Patent Application Laid Open 1993-181980, shapes were corrected by correlating the parameter of the shape calculating equation proper for the measurement method used for two-dimensional or three-dimensional shapes and the index value and by adjusting the parameters mentioned above. However, the correction method was not for the general use and it was often difficult to apply the method to any two-dimensional or three-dimensional shape measuring method. For example, it could not be applied to measurement methods having no parameters to control shape at the time of calculating shapes such as scanning probe microscope (hereinafter referred to as "SPM"). And due to the fact that the freedom of varying shape by correction depended on the model equation used in the calculation of shape, it was not suitable for objects of correction having a wide room for the variation of shape.

Also in the past it was difficult to visualize and easily carry out a learning operation. For example, when a shape is to be corrected, a learning step is required for expressing in advance the relationship with parameters expressing the magnitude and the degree of correction of the shape index value (for example the degree of rounding the shape of corners) in a look-up table or any equation. However, it was difficult for any operator not having sufficient knowledge relating to algorithm inside to judge what kind of parameters should be supplied and whether a sufficient learning had been made, and the learning operation was generally a complicated and difficult operation.

SUMMARY OF THE INVENTION

One aspect of the present invention is directed a method and apparatus for measuring shapes wherein two-dimensional or three-dimensional shapes and shape index values can be easily related.

Another aspect of the present invention is directed to a method and apparatus for measuring shapes wherein the two-dimensional or three-dimensional shapes calculated can be easily corrected on the display screen.

The aspects of the present invention make it possible to estimate, for example, the features of semiconductor devices or the state of a semiconductor manufacturing process from the two-dimensional or three-dimensional shapes acquired, while in the past it was difficult to estimate the features of semiconductor devices or the state of a semiconductor manufacturing process from the two-dimensional or three-dimensional shapes even if high-precision two-dimensional or three-dimensional shapes of semiconductor patterns were acquired.

According to the aspects of the present invention, a method and an apparatus for measuring a shape of a specimen are characterized as follows.

The two-dimensional or three-dimensional shape of semiconductor patterns (groups of two-dimensional or three-dimensional coordinates of measured points) measured by any two-dimensional or three-dimensional shape measuring method is corrected by determining the correction range thereof and by applying any curvature equation to a group of measured points within the correction range, and the two-dimensional or three-dimensional shape is corrected by adjusting the parameters of the curvature equation based on the shape index values calculated separately.

The relationship between the above-mentioned shape index value and the above-mentioned parameter is separately learned as required for each semiconductor manufacturing process or each design data of materials or pattern dimensions, the relationship is stored in the data base, and the measured shapes are corrected based on the above-mentioned relationship at the time of measurement.

The apparatus includes a GUI (graphic user interface) capable of simultaneously displaying all or a part of the two-dimensional or three-dimensional shapes measured (including shapes before/during/after correction), or shape index values, or relationship between a curvature equation and parameters, or two-dimensional or three-dimensional shapes learned (or parameters of a curvature equation) and shape index value, or control shapes in order to grasp the state of learning or to recognize the result of measurement and capable of visualizing the measurement errors at the time of the above-mentioned learning or the above-mentioned measurement.

The control shape mentioned above means a shape to be referred to at the time of correction of shape. It is a shape useful for comparing, for example, SEM images acquired by observing the sectional shape of semiconductor patterns at points of measurement cut out by a focused ion beam system (hereinafter referred to as "FIB") and the like, or the two-dimensional or three-dimensional shape of semiconductor patterns measured by a SPM and the like, or the correct shape of sectional shapes handwritten by users, or any similar shapes or corrected shapes (for example, sectional shape of samples having smaller or larger shape index values relative to the shape index value of the object being corrected).

The high-precision information acquired in two-dimensional or three-dimensional shape enables to calculate shape parameters expressing characteristically the shape mentioned above (for example, in the case of indexing the roundness degree of the bottom footing shape at the bottom of a line pattern, the curvature of shape in the skirt part mentioned above, or the volume of the skirt part mentioned above). The measured two-dimensional or three-dimensional shapes or the shape parameters are correlated with the features of the semiconductor device or the state of the manufacturing process of semiconductor and the correlation is displayed in graphs or the like. In addition, the features of semiconductor devices and the state of the semiconductor manufacturing process are presumed on the basis of the two-dimensional or three-dimensional shape measured based on the correlation mentioned above and the shape parameters mentioned above.

The effects of the present invention are roughly as mentioned in the following items (1) to (8).

According to the aspects of the method and apparatus for measuring a shape of a specimen of the present invention, (1) high-precision two-dimensional or three-dimensional shapes of the noteworthy points in the object of measurement can be acquired at a high velocity from images acquired by SEM. And the two-dimensional or three-dimensional shapes are expressed by the parameters of a curvature equation by fitting any curvature equation in the correction range of the two-dimensional or three-dimensional shapes of any semiconductor patterns measured by any two-dimensional or three-dimensional shape measuring method, (2) the correlation of two-dimensional or three-dimensional shapes and shape index values is facilitated through the use of the parameters of the curvature equation, (3) the transformation of two-dimensional or three-dimensional shapes is expressed by changes in a small number of parameters of the curvature equation and in addition it will be possible to correct with a high precision a large variety of shapes. (4) It will be possible to apply generally the method and apparatus to the two-dimensional or three-dimensional shapes acquired by any measuring method.

At the time of learning (5) it will be possible to promote visually learning without being aware of the internal processing by simultaneously displaying the corrected shape and the control shape and adjusting the parameters of the curvature equation by comparing them so that both of them may agree. And at the time of learning and at the time of measurement similarly (6) it will be possible to visualize and analyze the shape errors by indicating simultaneously the corrected shape and the control shape. Furthermore, (7) it will be possible to grasp the state of learning and to judge whether the learning should be continued or terminated by displaying the relationship between the relationship between the two-dimensional or three-dimensional shapes learnt (parameters of the curvature equation) and the shape index value.

At the time of measurement, (8) it will be possible to estimate or monitor the features of semiconductor devices or the state of semiconductor manufacturing process from high-precision two-dimensional or three-dimensional shapes of the objects thus acquired and to develop the present invention to the control of the semiconductor manufacturing process.

These and other objects, features and advantages of the invention will be apparent from the following more particular description of preferred embodiments of the invention, as illustrated in the accompanying drawings.

BRIEF DESCRIPTION OF THE DRAWINGS

FIG. 7A is a graph showing the measured shape, and FIG. 7B is a graph showing the state of segmenting the measured shape shown in FIG. 7A and fitting plural curves thereto, while FIG. 7C is a graph showing the control shape used for correcting the measured shape.

DESCRIPTION OF THE PREFERRED EMBODIMENTS

The present invention will be described with reference to FIGS. 1A and 1B to 14.

The present invention enables to reconstitute a two-dimensional or three-dimensional shape of a higher precision by acquiring two-dimensional or three-dimensional shape of a semiconductor pattern by means of any two-dimensional or three-dimensional measuring means and by correcting the two-dimensional or three-dimensional shape mentioned above by a shape index value acquired from an image feature value related with the three-dimensional shape mentioned above. Any two-dimensional or three-dimensional measuring means represents, for example, stereo image measurement by using tilt SEM images or measurement by means of SEM.

We will describe, as an embodiment of the present invention, the process of correcting the three-dimensional shape (sectional shape) of an object of measurement measured by means of SEM images based on the shape index value calculated from the SEM images. However, the above-mentioned three-dimensional measuring means according to the present invention are not limited to those using the SEM images. To begin with, FIGS. 1A and 1B shows the overall flow of the process. FIG. 1A shows the flow at the time of learning and FIG. 1B shows one at the time of measurement.

[1. During Learning]

We will describe below the flow of operation during learning along the flow shown in FIG. 1A.

[1.1 Acquisition of SEM Images]

To begin with, in step 101 of FIG. 1A, either one or both of secondary electron image (hereinafter referred to as SEM (scanning electron microscopy) image or backscattered electron (hereinafter referred to as BSE) image of the object is or are acquired. The image acquired here includes a part or the whole of a top-down image acquired by observing the object of measurement from the vertical direction or a part or the whole of a tilt image acquired by observing the same from any inclined angle direction.

Figure 1:
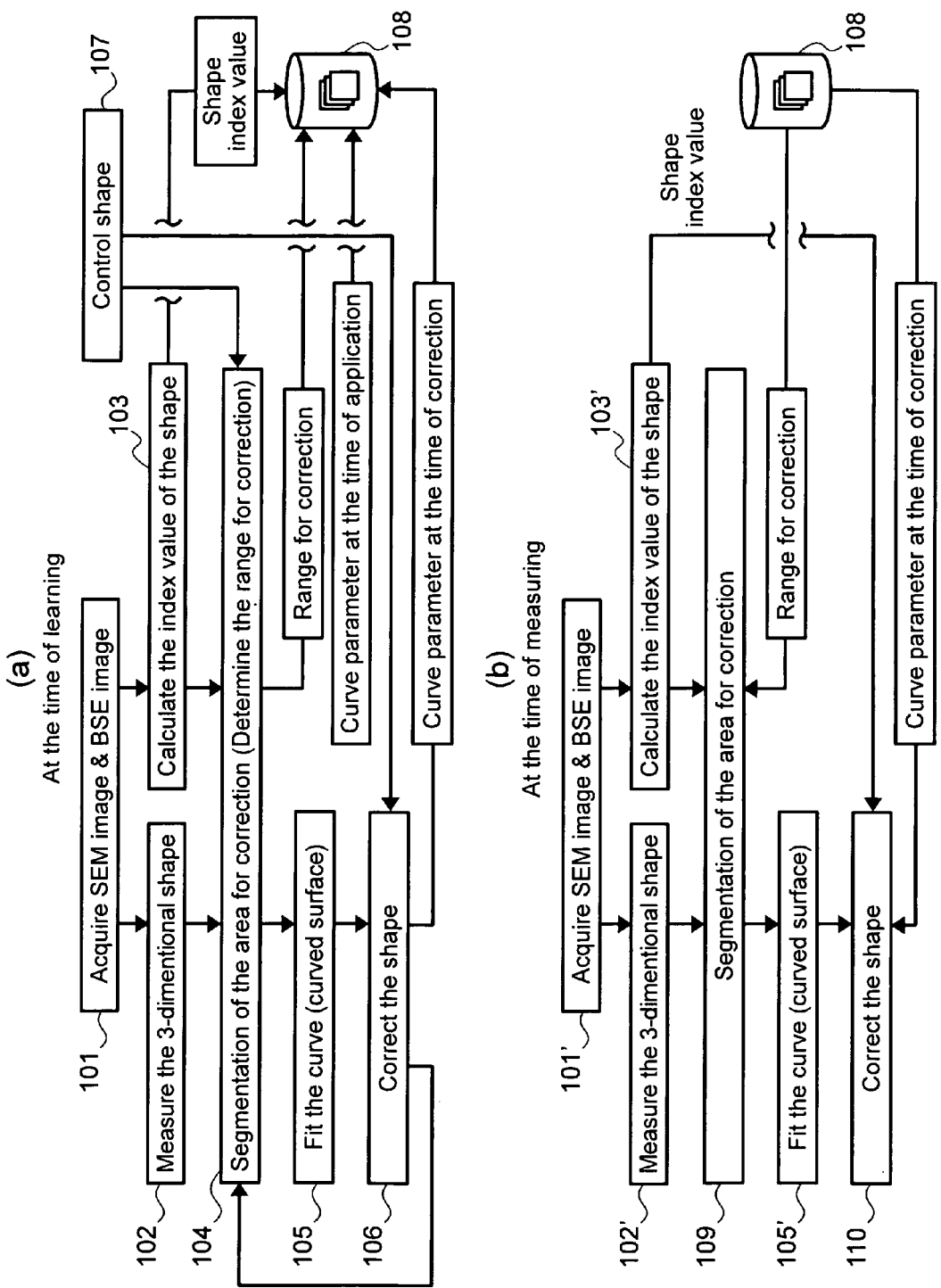
FIG. 1A is a flowchart showing the flow of processing at the time of learning.
FIG. 1B is a flowchart showing the flow of processing at the time of measurement.
Figure 2:
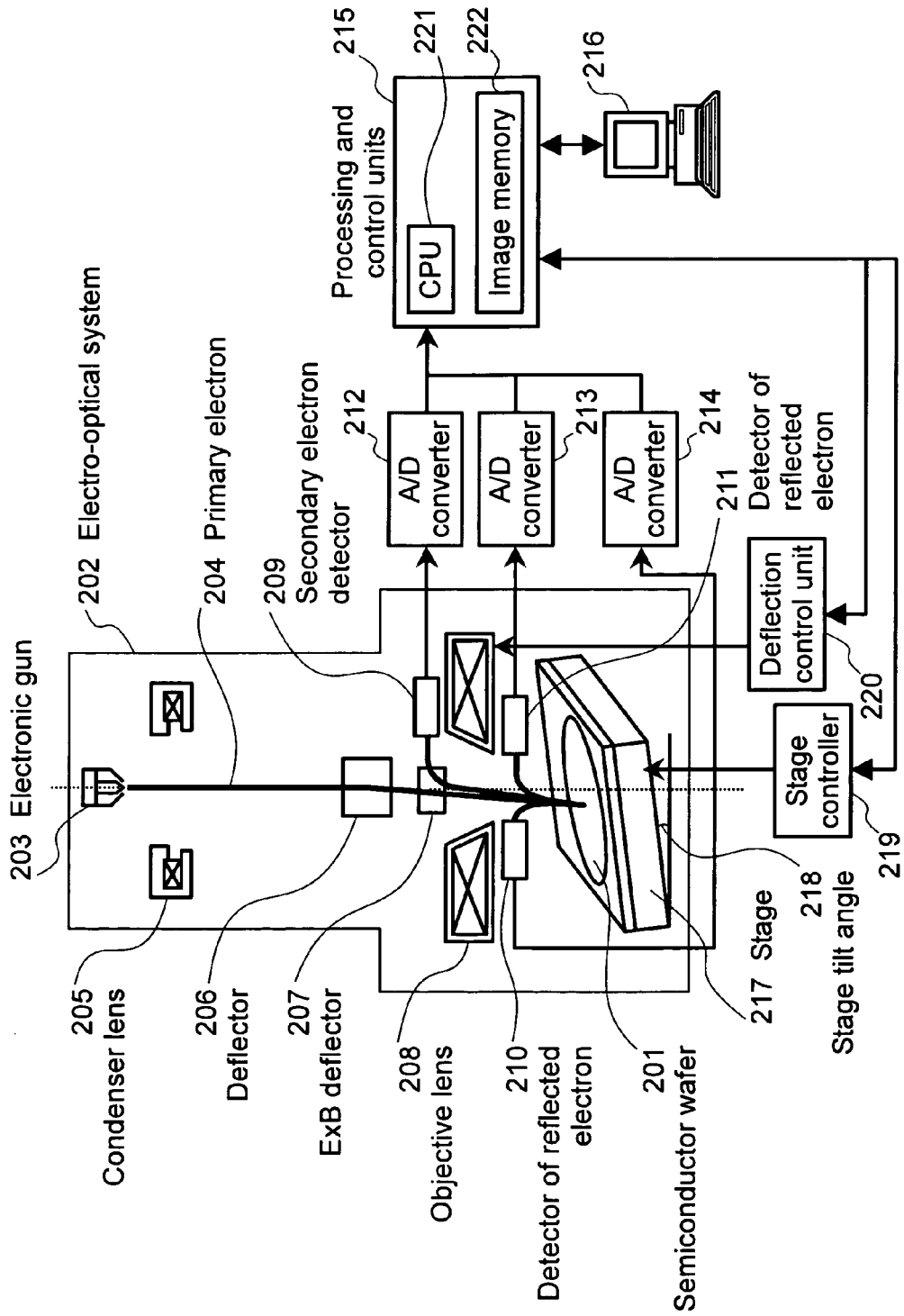
FIG. 2 is a diagram showing an embodiment of the system for realizing the present invention.

FIG. 2 shows an example of the system for acquiring and processing a SEM image and a BSE image. The code 203 represents an electron gun, which generates primary electrons 204. A deflector 206 deflects electron beams 204 to control the position where a semiconductor wafer 201 constituting a specimen is exposed to electron beams. The semiconductor wafer 201 exposed to a primary electron 204 discharges secondary electron and BSE, the secondary electron being detected by a detector of secondary electron 209. On the other hand, the BSE is detected by the BSE detectors 210 and 211. The BSE detectors 210 and 211 are installed in mutually different directions. The secondary electron and the BSE detected by the secondary electron detector 209 and the BSE detectors 210 and 211 are converted into digital signals by A/D converters 212, 213 and 214, stored in an image memory 222 and are image processed adequately by a CPU 221 for the purposes for which they will be used.

Figure 3:
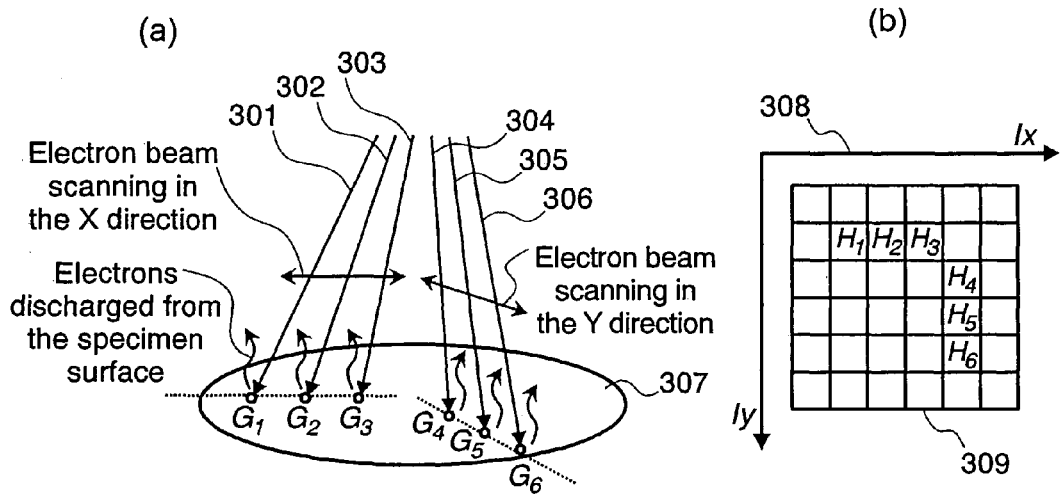
FIG. 3A is an illustration showing schematically the scanning direction of electron beams applied on a semiconductor wafer and the electrons discharged from the wafer.
FIG. 3B is an illustration showing a method of converting the amount of signals into picture images by detecting the electrons discharged from the wafer.
Figure 4:
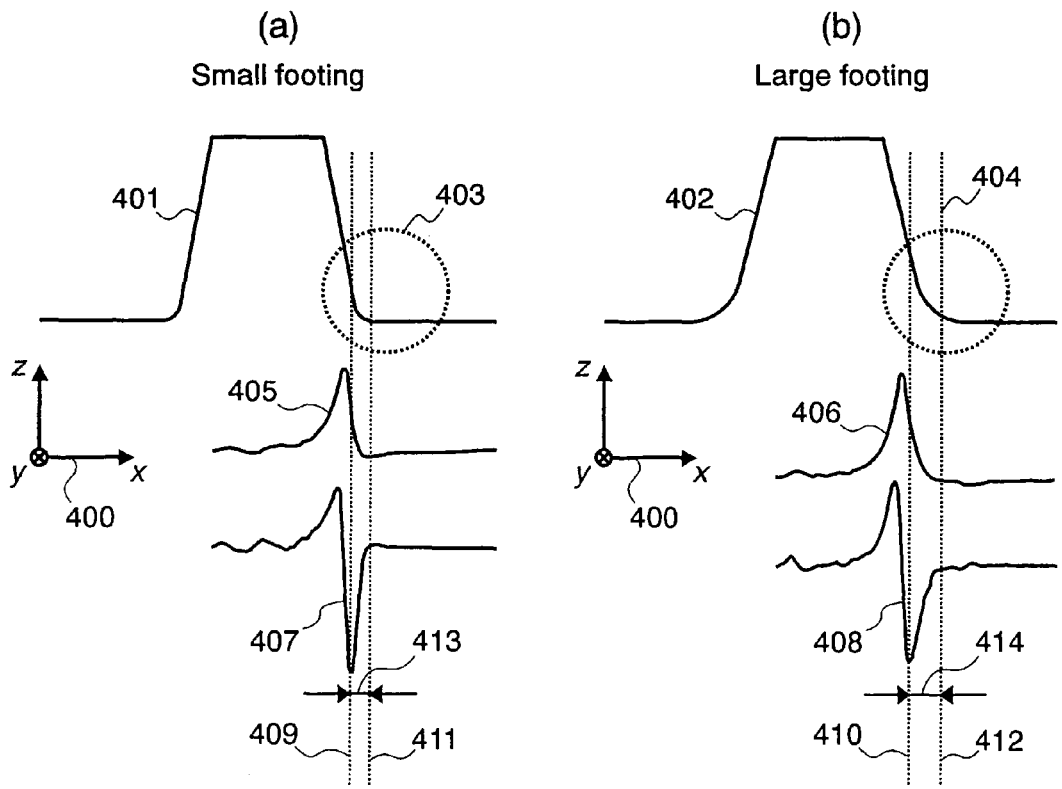
FIG. 4A is an illustration showing a method of calculating the shape index value from the sectional shape of patterns with a small fitting and the amount of signals from the SEM image.
FIG. 4B is an illustration showing a method of calculating the shape index value from the sectional shape of patterns with a large fitting and the amount of signals from the SEM image.
Figure 5:
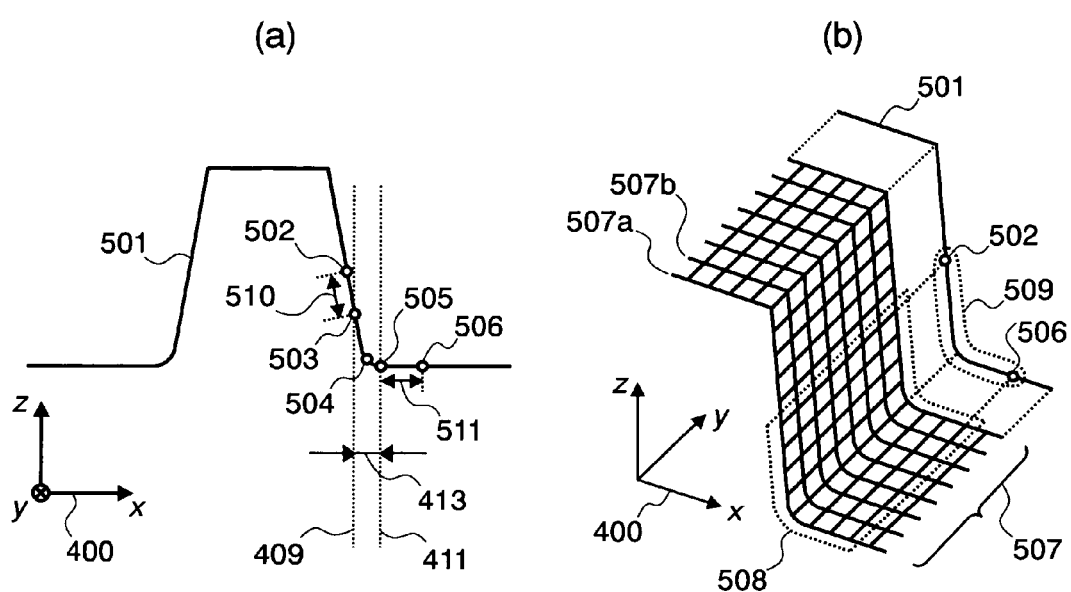
FIG. 5A is a graph showing the correction range of measured shapes set for the average profile.
FIG. 5B is an illustration showing the correction range of measured shapes set for a group of three-dimensional points measured in the direction of the x-y axis.

FIG. 3 shows a method for converting the amount of electron signals discharged on the semiconductor wafer when a semiconductor wafer is scanning irradiated with electron beams to create picture images. The semiconductor wafer is scanning irradiated with the primary electron 204, for example as shown in FIG. 3A, in the x and y directions as shown by 301 to 303 or 304 to 306. It is possible to change the scanning direction by changing the deflection direction of the primary electron 204. The positions on a semiconductor wafer where the semiconductor wafer was scanning irradiated with the primary electron 204 scanning in the x direction as shown by 301 to 303 are respectively represented by G1 to G3. Similarly, the positions on a semiconductor wafer where the semiconductor wafer was scanning irradiated with the primary electron 204 scanning in the y direction as shown by 304 to 306 are respectively represented by G4 to G6. The amount of electron signals discharged at G1 to G6 mentioned above will be respectively transformed into the luminosity value of pixels H1 to H6 in an image 309 shown respectively in FIG. 3B (the small appendages $_{1-6}$ on the right bottom side in G and H correspond each other). The code 308 represents a coordinate system showing the x and y directions on the image.

The code 215 in FIG. 2 represents a computer system, which carries out image processing to estimate three-dimensional shapes (sectional shapes) from images observed on a semiconductor wafer 201, to calculate shape index values, and to correct the above-mentioned three-dimensional shapes (sectional shapes) based on the above-mentioned shape index value, or to send out control signals to a stage controller 219 or the deflection controlling unit 220. And the processing and control unit 215 is connected with a display 216, and has a GUI (graphic user interface) that shows images to the user.

The code 217 represents a XY stage, displaces the semiconductor wafer 201 and enables to take pictures at any position of the semiconductor wafer.

FIG. 2 shows an embodiment having two BSE image detectors. However, the number of the BSE image detectors can be increased or decreased. And the computer system 215 processes and controls the control signals at the time of image pickup, processes to estimate three-dimensional shapes (sectional shapes) from the observed images and to calculate shape index values as mentioned above. However, it is possible to distribute a part of these operations to plural operation terminals and have them carry out the operations.

The means of acquiring tilt images by observing the object of measurement from any tilt angle direction by using the apparatus shown in FIG. 2 includes: (1) the system of deflecting electron beams applied by the electro-optical system, tilt the radiation angle of electron beams to take tilt images (refer for example Japanese Patent Application Laid Open 2000-348658), (2) the system of tilting the stage 217 for displacing the semiconductor wafer (in FIG. 2 the stage is tilted by a tilt angle 218), (3) the system of tilting mechanically the electro-optical system itself.

[1.2 Measurement of a Three-dimensional Shape]

A SEM image or a BSE image acquired as described above are used to measure the three-dimensional shape (sectional shape) of the object of measurement instep 102 of FIG. 1A. The methods of measuring three-dimensional shapes (sectional shapes) include the stereo method for calculating depth information from tilt SEM images obtained by taking images from plural observation directions based on the principle of triangulation, the shape from shading method (see, for example, Japanese Patent Application Laid Open 2003-315029) for obtaining depth information by integrating the gradient at each point of measurement obtained by taking into account the relationship between the amount of SEM signals and the gradient of the shape of the object of measurement, the method of acquiring depth information by integrating the gradient at each point of measurement obtained by taking into account the relationship between the amount of BSE signals and the gradient of the shape of the object of measurement (see, for example, Japanese Patent Application Laid Open 2000-146558), and the like.

The positions of acquiring and the processing method of three-dimensional information are varied as shown in FIG. 5B. Specifically, regarding a xyz coordinate system 400 shown in FIG. 5B, the method of seeking height information in the z axis direction at each point of measurement set for example in the grid distribution against the x-y axis directions (two-dimensional directions) (a group of three-dimensional points 507. The figure is a wire-frame representation linking various points of measurement by direct lines), the method of setting representative measurement points along the y axis and acquiring height information in the z axis direction at various points of measurement set in the x axis direction (one-dimensional direction) (for example, groups of three-dimensional points 507a or 507b), or the method of acquiring an average profile (a group of three-dimensional points 501) by adding up in the y axis direction the three-dimensional shape (sectional shape) 507 in the two-dimensional directions obtained, and the like. In the following description, we will describe by taking up specially the case of setting a correction area for an average profile 501 and proceeding to a shape correction, and similar operations are possible for a group of three-dimensional points 507 measured in the x-y directions, or a group of three-dimensional points 507a or 508a measured at any point of measurement.

[1.3 Calculation of Shape Index Value]

In step 103 of FIG. 1A, the shape index value correlated with any three-dimensional shape (sectional shape) of the object of measurement is calculated by using SEM images or BSE images. The calculation method of the shape index values mentioned above is different depending on the type of shape of semiconductor patterns to be corrected (the above-mentioned type of shape will be described further below). We will take up in particular, for example, the case of choosing the footing of line patterns (bottom footing shape part of the bottom part) as the object of correction, and we will show in FIG. 4 the method of calculating the shape index value showing the degree of roundness of the footing from SEM images.

In FIGS. 4A and 4B, the sectional shape of line patterns 401 and 402 respectively show a sample 401 with small footing and a sample 402 with large footing (the approximate positions of the footing part are shown by 403 and 404). The amount of SEM signals respectively corresponding to the sectional shapes 401 and 402 is shown by 405 and 406, and similarly the corresponding differential profiles of SEM signal amount are shown by 407 and 408. In order to measure the magnitude of bottom footing shape, for example distances 413 and 414 with peak positions 409 and 410 of the differential profiles of the amount of SEM signals and positions 411 and 412 at which the differential profiles approach zero are defined as the shape index values. In other words, due to the fact that the shape index values tend to grow larger as the footing grows larger in the present example, it will be possible to judge the magnitude of footing from the magnitude of the index values thereof. And for the profile 405 and 406 of the amount of SEM signals (scanning in the x direction of the coordinate system 400) used in calculating the above-mentioned shape index values and the like, the amount of SEM signals at any y coordinate may be used, and the average profile in the neighboring area in the y axis direction may be used.

The method of calculating shape index values described here is an example, and the calculating method of shape index values according to the present invention includes methods of picking up any distinctive features obtainable from image information, and the above-mentioned image information includes the combination of a part or the whole SEM image or BSE image obtained by observing in the top-down direction or in a tilt direction.

[1.4 Segmentation of Correction Area]

In step 104 of FIG. 1A, the range of correction in the three-dimensional shape (sectional shape) obtained in step 102 is set. The range of correction is selectively set for points to be corrected within the range of measurement. This will enable to select curvature equations more specialized for the shape of objects within above-mentioned correction area when the shape of objects within the correction area is expressed by a curvature equation, and this will remove the necessity of giving extra freedom of expressing the shape of objects outside of the above-mentioned correction area to the curvature equation. The range of correction will be determined on the basis of the three-dimensional shape (sectional shape) mentioned above or the range of calculating shape index values. FIG. 5A is graph showing an example of the method of setting the range of correction in the case of choosing the footing of line pattern as the object of correction. The shape 501 shows the three-dimensional shape (sectional shape) of the object measured in the step 102 of FIG. 1A.

To begin with, we will show an example of the method of determining the range of correction based on the three-dimensional shape (sectional shape) of the object measured. A point 504 shows a point where the curvature is the maximum in the vicinity of the bottom part of the sectional shape. There is a method of choosing an area separated by any distance from the point 504 with the point 504 serving as the reference point (for example, a range from the point 502 to the point 506) as the range of correction taking into account the fact that the footing develops approximately in this vicinity.

We will then show an example of the method of determining the range of correction based on the range of calculating shape index values. The codes 409 and 411 in FIG. 5A show the range of calculating the shape index values relating the footing calculated in FIGS. 4A and 4B. There is a method of choosing the range from the point 503 to the point 505 as the range of correction taking into account that footing develops approximately within this range. And if it is necessary to set a somewhat wider range of correction, it is possible to set a range from the point 502 to the point 506 as the range of correction by expanding a range of correction from the above-mentioned point 503 to the point 505 in coping with the requirement (in the figure, the width of expansion is given by 510 and 511).

FIG. 5A describes the method of setting the range of correction for the average profile 501, and similarly it is possible to set the range of correction similarly for a group of three-dimensional points 507 measured in the x-y axis direction (two-dimensional direction) shown for example in FIG. 5B. In other words, it is possible to set a range 508 of correction corresponding to the correction range 509 (a range extending from the point 502 to the point 506 for a group of three-dimensional points 507 and determine the range 508 of correction.

Apart or all the parameters used for setting the range of correction including the method of setting the range of correction determined here and the degree of expanding the above-mentioned range of correction (width or expansion ratio) are stored as required in the data base 108 of FIG. 1A.

[1.5 Fitting Curves (Curved Surface)]

In step 105 of FIG. 1A, curved surfaces or curves are fitted on a group of points within the range of correction set in step 104 among the three-dimensional shapes (a group of three-dimensional points) acquired in step 102. The group of points to which the curved surfaces or curves mentioned above are fitted includes, for example, a group of points included in the correction range 509 among the three-dimensional shapes 501 in FIG. 5B, or a group of points included in the range of correction 508 among the three-dimensional shapes 507 and the like. In the case of the former, curves are fitted, and in the case of the latter, curved surfaces are fitted, or a curve is fitted to each line of measurement. We will now describe the details for the former.

Figure 6:
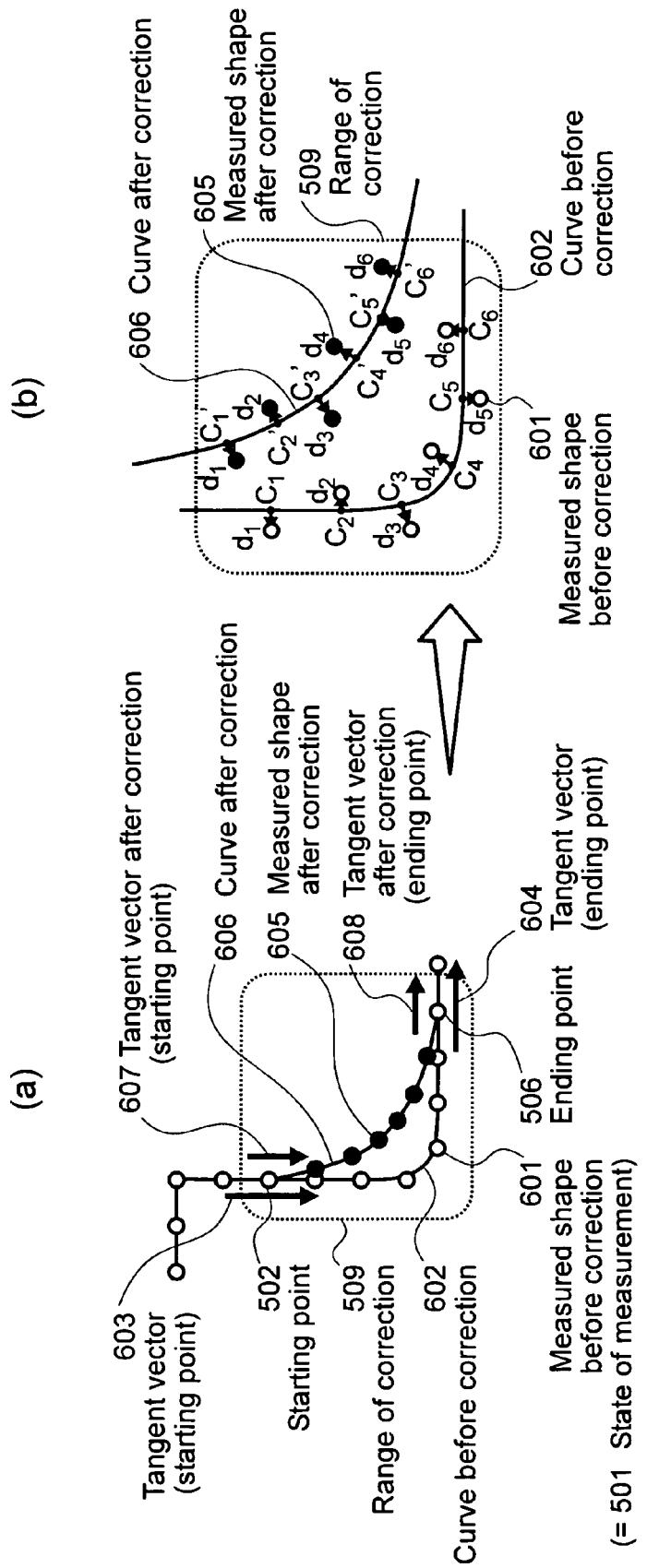
FIG. 6A is a graph showing the state of fitting the curve 602 to a measured shape 601.
FIG. 6B is a graph showing an enlargement of a correction range 509 of FIG. 6A.
Figure 7:
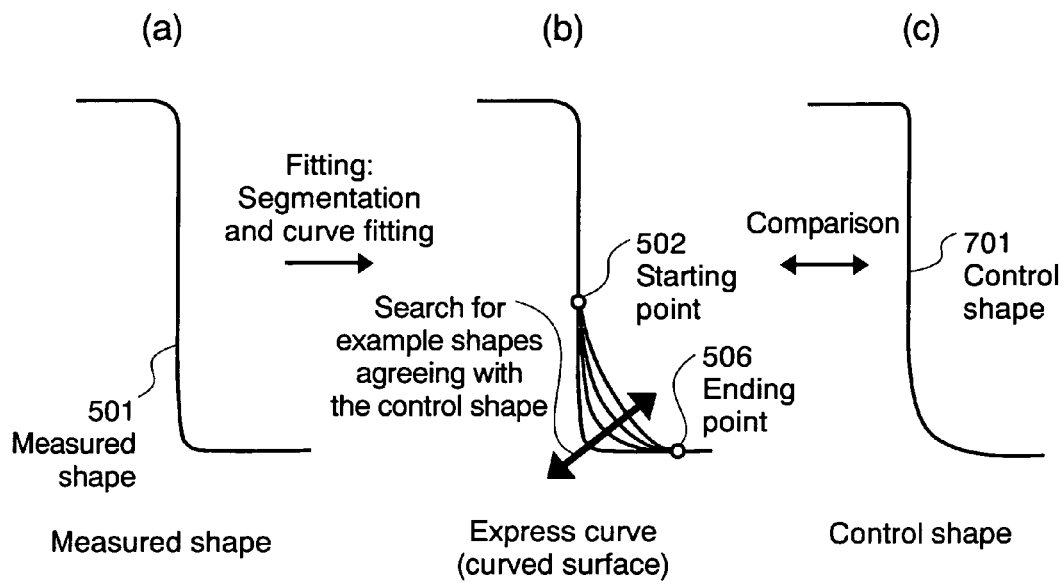
Figure 8:
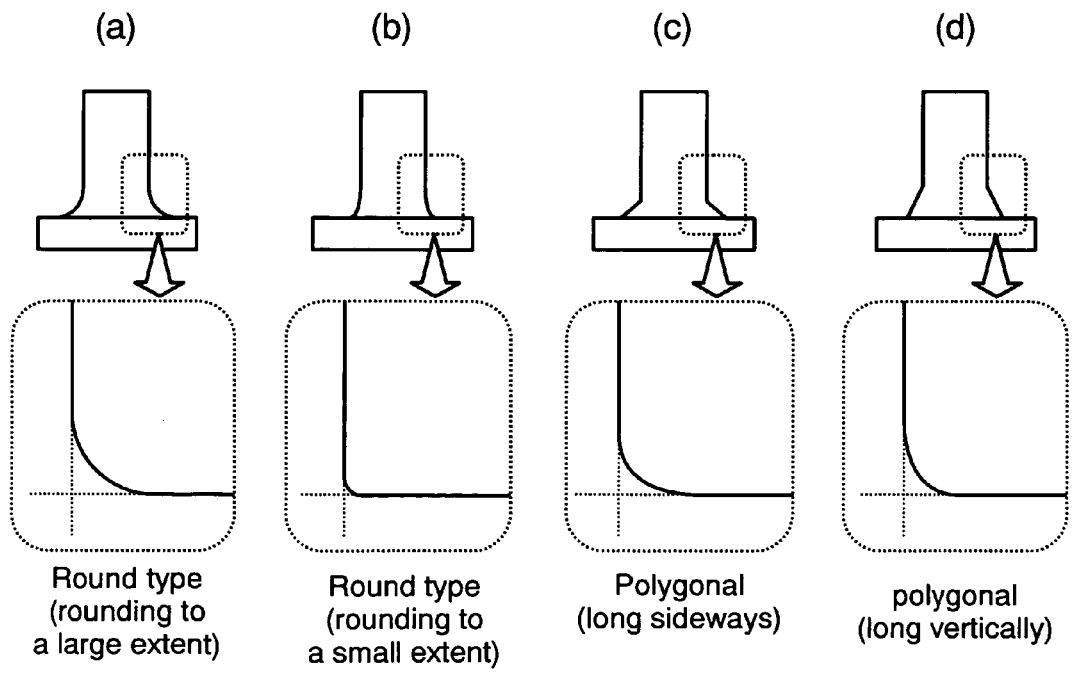
FIG. 8A is a graph showing the shape of a generally rounded large footing.
FIG. 8B is a graph showing the shape of a generally rounded small footing.
FIG. 8C is a graph showing the shape of a polygonal footing with a longer horizontal axis.
FIG. 8D is a graph showing the shape of a polygonal footing with a longer rising axis.
Figure 9:
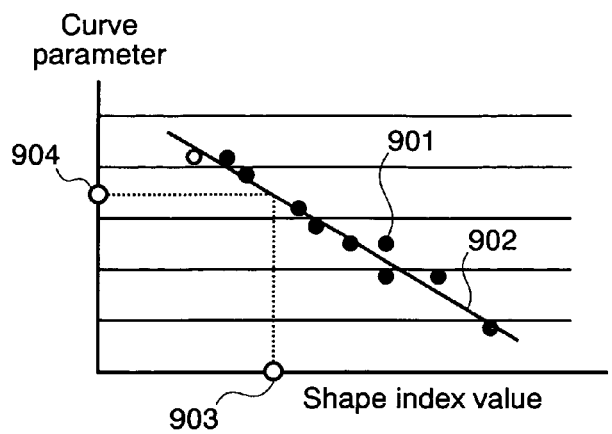
FIG. 9A is a graph showing the relationship between the shape index values and curvature parameters.
FIG. 9B is a three-dimensional graph showing the relationship between the shape index values and a curvature parameter 1.
FIG. 9C is a three-dimensional graph showing the relationship between the shape index values and a curvature parameter 2.
Figure 9:
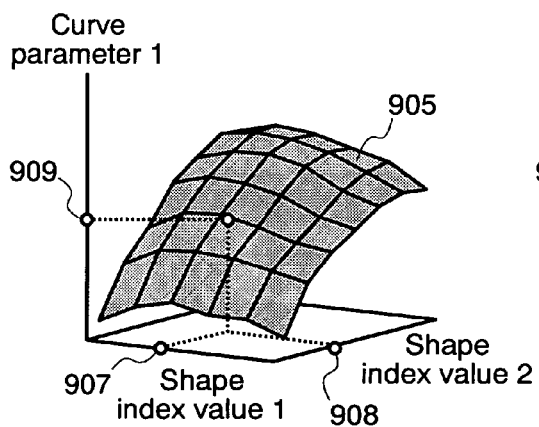
Figure 9:
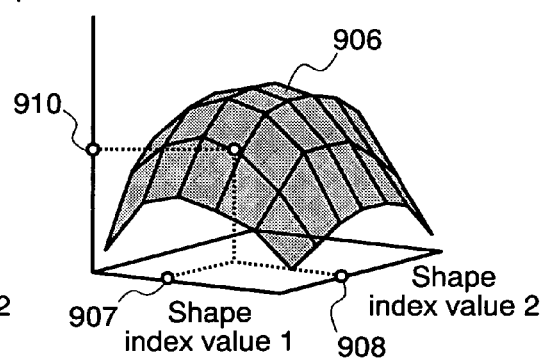
Figure 10:
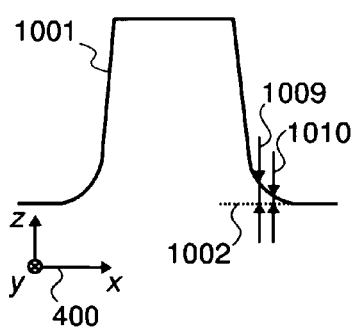
FIG. 10A is a graph showing the case where the thickness of the footing shape relative to the grounding in any X coordinate for the sectional shape of the pattern is known.
FIG. 10B is a graph showing a method of converting the roundness volume of the fitting part for the sectional shape of the pattern into feature value.
FIG. 10C shows a method of calculating and converting a range 1007 in the X direction and a range 1008 in the Z direction of the footing part for the sectional shape of the pattern into feature intensity.
Figure 10:
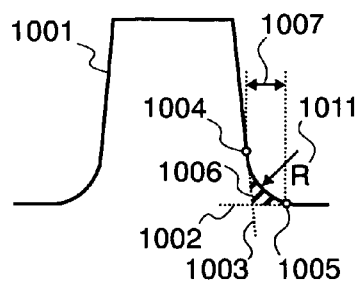
Figure 10:
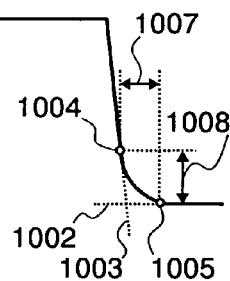

FIG. 6 shows the state of fitting a curve 602 to the measured shape 601 drawn up with white points. The variation of the curve 602 to be fitted may include various types of curves such as representative spline, Bezier, NURBS (non-uniform rational B-spline) and the like, or the number dimensions of curves (degree of freedom), or the range to be fitted (whether the whole correction range 509 is to be fitted with a curve, or the correction range 509 is further split and fitted regionally) and the like. However, we will describe below the case of fitting cubic spline curve to the whole range of correction.

The cubic spline curve is determined by setting respectively the positions of the starting point and the ending point of the curve as well as the tangent vector at the positions of the above-mentioned starting point and the ending point. The starting point and the ending point correspond to the both ends of the range of correction set in the step 104 and are given for example by the starting point 502 and the ending point 506 (refer to FIGS. 5A and 5B, and FIG. 6A). And FIG. 6A shows schematically the tangent vectors at the starting point and the ending point respectively by 603 and 604. And values that agree most closely with the three-dimensional shape (sectional shape) 601 obtained by adjusting and measuring the strength and direction of the tangent vectors mentioned above 603 and 604 are sought. FIG. 6B is an enlargement of the inside of the correction range 509 of FIG. 6A. However, as the curve 602 to be fitted does not agree perfectly with the measured three-dimensional shape (sectional shape) 601, a tangent vector at which the total sum of separation distance between them becomes the minimum is sought for example. The control parameter of the curve to be determined here was the tangent vectors at the starting point and the ending point. However, in Bezier curve for example, the control point or what is called "knot" corresponds to it.

The control parameter of the curve that must be adjusted at the time of shape correction (step 106) will be hereinafter referred to as "curve parameter." The curve parameter mentioned above does not necessarily correspond to all the control parameters, and it may for example adjust only the strength of the tangent vector at the time of correction, and the direction of the tangent vector may be fixed at any value (in that case, the curve parameter will be the strength of the tangent vector). And here the control parameter agreeing most closely with the three-dimensional shape 601 (sectional shape) before correction is calculated. At the time of correction, however, if the information of a part or all of the control parameters agreeing most closely with the above-mentioned three-dimensional shape (sectional shape) 601 before correction is not required, the determination of a part of or all the curve parameters agreeing most closely with the above-mentioned three-dimensional shape (sectional shape) 601 before correction may be omitted.

[1.6 Correction of Shape]

In the Step 106 of FIG. 1A, the shape is corrected on the basis of the curve obtained in the Step 105. FIGS. 6A and 6B shows an example of corrected shape by black points 605. With regards to the method of correcting the measured shape, we will describe the flow of operations with reference to FIGS. 7A to 7C.

It will be possible to change the measured shape by changing the curve parameters mentioned above by fitting the curve to the range of correction (a range extending from the starting point 502 to the ending point 506 of FIG. 7B) of the measured shape 501 shown in FIG. 7A. Generally, the number of the above-mentioned curve parameters is limited, and the shape may be deformed more easily than handling directly the point group data. At the time of learning, the curve parameters mentioned above are adjusted, the measured shape is corrected to a shape agreeing most closely with the actual sectional shape, the curve parameters at the time of correction and the shape index values calculated in the Step 103 are correlated to be stored in the data base 108 as learning data. At this time, the curve parameters resulting from the operation of fitting the curve to the measured shape in the step 105 are, depending on the requirement, similarly correlated and stored. However, the values to be stored as mentioned above are replaced by information required to determine the corrected shape from the shape index values at the time of measurement that we will describe in details further down (step 110) such as, for example, the ratio between the curve parameters at the time of correction mentioned above and the shape index value. Or they may be stored with the addition of the above-mentioned information.

For correcting the measured shape to a shape that seems to agree most closely with the most actual sectional shape as mentioned above, a control shape 701 (107 of FIG. 1) as shown in FIG. 7C can be used. The control shape 701 is a shape that will be referred to at the time of correcting shape, and may be for example a correct shape or any similar shape taking the form of a SEM image obtained by observing the sectional shape of a semiconductor pattern cut out by FIB and the like at the position of measurement, or the three-dimensional shape (sectional shape) of a semiconductor pattern measured by SPM and the like, or a sectional shape and the like hand drawn by the user. And shapes useful or effective for comparison for determining the corrected shape (for example, the sectional shape of samples having a smaller or larger shape index value relative to the shape index value for the object being corrected) are also included in the above-mentioned control shape.

We will now describe an example of the method of linking the modification of a curve with the modification (correction) of the measured shape with reference to FIG. 6B. Concomitant with the curve modification mentioned above, the measured shape 601 must also be modified, and therefore for the method 1, the method of using the above-mentioned curve as the corrected measured shape may be adopted. As the method 1 involves the loss of such information as the gap of shape or roughness that could not be expressed by the degree of freedom of the curve set, for the method 2, the method of calculating respectively for example the distance of separation d1-d6 between the curve 602 and the measured shape 601 shown in FIG. 6B and modifying the measured shape 605 so that the above-mentioned distance of separation may be stored before and after the correction of the curve maybe adopted. Here, the parameters t of the cubic spline curve for the corresponding serial number i are identical at the points $Ci(i=1-6)$ on the curve 602 before correction whose distance is the shortest with each point of the measured shape 601 before correction shown in FIG. 6B and the points $Ci'(i=1-6)$ on the curve after correction 606 whose distance is the shortest with each point of the measured shape before correction 605 shown in FIG. 6B. Where, the cubic spline curve Ci is expressed by $Ci(t)=A1*t^3+A2*t^2+A3*t+A4$ (C(t) is a coordinate vector on the curve, and A1-A4 are coefficient vectors having the same number of dimensions as C(t)).

And in the step 106, in the case where the measured shape cannot be brought close to the control shape even when the measured shape is corrected and the curve parameters are adjusted, the method of setting correction areas in the Step 104 may be changed or the curvature equations used may be changed as required.

FIGS. 8A and 8D show four variations as examples of correction of the footing shapes. FIG. 8A to 8D show respectively an example of generally round large footing, that of generally round small footing, that of vertically oblong polygonal footing, and that of horizontally oblong polygonal footing. In each of 8A to 8D of the same figure, the upper section shows schematically the shape of the grounding and the line pattern, and the lower section shows the curve shape for which the values of curve parameters are set in such a way that the shape of the footing part enclosed by a broken line in the upper section may be expressed. A variety of types of shape can be expressed by the correction of shapes by using a same curvature equation.

[1.7 Data Base]

The data base 108 contains parts of or the whole information such as shape index values (including the information relating to the range of calculating shape index values as required), the methods of setting range of correction, or parameters used for setting range of correction showing the degree of expanding the range of correction, curvature equations fitted to measured shapes, the relationship between curve parameters and shape index values, and the like. All of such items are stored being correlated with the object samples measured. These methods and parameter groups will be referred to hereinafter altogether as "the corrected method information."

Data showing the relationship between curve parameters and shape index values include, for example, the linear relationship 902 between the two values shown in FIG. 9A. The figure with the horizontal axis representing shape index values and the vertical axis representing curve parameters plots the values of several examples of measurement samples by black points (for example 901), and fits a straight line 902 for the point group plotted. The above-mentioned curve parameter means different things depending on how the shape is corrected. Here, however, it means the strength of tangent vector at the terminal points (starting point and ending point) after correction. The linear relationship of the straight line 902 is expressed by coefficients A, B, C, and D of the following equation.

(Curve parameter 1 (strength at the starting point)=
A*(shape index value)+B    (Equation 1)

(Curve parameter 2 (strength at the ending point)=
C*(shape index value)+D    (Equation 2)

Of course, (Equation 1) and (Equation 2) represent respectively an example of how correction is made. And curve parameters are often linked by a relationship of quadratic equation or higher relating to shape index values. And when a condition is set that the strength ratio of tangent vector at the starting point and the ending point remains constant (for example, the previous strength ratio of curve fitted to the measured shape before the correction remains unchanged after the correction) and the like, for (Equation 1) or (Equation 2) either one coefficient maybe sought. When the above-mentioned linear relationship 902 is acquired by learning, at the time of measurement, curve parameters (for example 904) can be acquired by calculating shape index values (for example 903), and the corrected shapes can be acquired.

Incidentally, there are cases where the shape of object is estimated by using plural shape index values involving different methods of calculating from images or plural shape index values calculated from plural different images (SEM image, BSE image or images with different tilt angles), or cases where there are plural curve parameters that needs to be adjusted for expressing the shape of object among the parameters for controlling the curves or curvature equations chosen in connection with the curve parameters. As a representative example of describing the case where there are plural such shape index values and curve parameters, we will take up in particular the case where there are two values for both the shape index value and the curve parameter and describe the method of estimating curve parameters from shape index values with reference to FIG. 9B and 9C.

Learning the relationship 905 between the above-mentioned shape index value and the curve parameters in FIG. 9B will enable to estimate the values (909) of the first curve parameter (referred to as "curve parameter 1") from the values (for example, respectively 907 and 908) of two shape index values (referred to respectively as "shape index values 1 and 2"). Similarly in FIG. 9C, learning the above-mentioned relationship 906 will enable to estimate the value (910) of the second curve parameter (referred to as "parameter 2") from the values (for example, respectively 907 and 908) of two shape index values. Such a method of seeking relationship among multiple variables is called "multi-variable analysis," and various methods are proposed. In the present invention, it is possible to apply the above-mentioned multivariable analysis method to seek the relationship between shape index values and curve parameters.

And for storing correction equation information in the data base, a part of or the whole information relating to object samples such as the manufacturing process of object samples (gating process, resist process, and the like), design data such as materials, the pattern dimensions and the like are related with the object samples and are stored as required. These conditions are put together and are referred to as "the process conditions."

We will now explain on the case where process information is required. At the time of measurement that we will describe in details further below, the measured shapes will be corrected based on the correction equation information mentioned above (for example, above-mentioned "Equation 1," "Equation 2" or the like) stored in the data base at the time of learning. However, the above-mentioned correction equation information is not always applicable commonly to what ever process conditions mentioned above (for example, each manufacturing process has different, coefficient A or B in (Equation 1). And there are cases where the correction points for which high-precision measurement is desired are different for each manufacturing process, and the correction points are often changed for each manufacturing process (for example, in the gating process, a precise measurement is desired in the footing part, and in the resist process, the same is desired in the top rounding part, and the like). As a result, it may be often necessary to proceed to such operations as controlling the correction equation information for each such process information, or learning for each such process information (for example, determining the method of setting the range of correction or the coefficient A and B for each process information), or changing the way of correcting measured shape for every such process information.

The method of setting the range of correction or the calculation of the coefficients A, B, C, D and the like are determined by learning a number of object samples as mentioned above. However, the learning is sometimes carried out by users and it is often set already at the time of shipment of the equipment. We will describe in details the latter case. As the learning operation requires burden on users, correction equation information for general use is made available as default values at the time of shipment of the equipment, or correction equation information is made available for every process information piece so that users may proceed to the correction of measured shapes by simply choosing different types of the above-mentioned correction equation information at the time of measurement. In other words, the learning operation by users as shown in FIG. 1A will be no longer necessary. However, when each user cannot obtain adequate correction equation information for all the samples chosen as the objects of measurement, or when the user cannot assume all the objects of measurement in advance, the user may customize the correction equation information by adopting the correction equation information made available as default values at the time of shipment of the equipment, or may newly learn.

[2. At the Time of Measurement]

We will describe below the operations at the time of measurement following the flow described in FIG. 1B.

[2.1 Taking SEM Image]

To begin with, either one of or both SEM image and/or BSE image of the object is taken in the step 101' of FIG. 1B. As this operation is identical with the step 101 in FIG. 1A, we will omit the description of the same.

[2.2 Measurement of Three-dimensional Shape (Sectional Shape)]

The SEM image or the BSE image acquired as described above is used to measure the three-dimensional shape (sectional shape) of the object of measurement in the step 102'. As this operation is identical with the step 102 in FIG. 1A, we will omit the detailed description of the same.

[2.3 Calculation of Shape Index Value]

The SEM image or the BSE image acquired in the step 103' of FIG. 1B is used to calculate the shape index values correlated with any three-dimensional shape (sectional shape) of the object of measurement. As this operation is identical with the step 103 in FIG. 1A, we will omit the detailed description of the same.

[2.4 Segmentation of the Correction Area]

The range of correction in the three-dimensional shape (sectional shape) of the object measured in the step 109 of FIG. 1B is set. The range of correction is determined based on the above-mentioned three-dimensional shape (sectional shape) or the range of calculation of shape index values. The method of setting the range of correction is basically identical with the step 104 in FIG. 1A, but it is different in that the correction is carried out based on the rule of setting the range of correction set in the data base 108 in advance. In other words, for example, a range of correction is set by integrating a correction method suitable for setting parts for correction depending on the process conditions (footing part, top rounding part, and the like) and by correcting the above-mentioned parts (determination based on the three-dimensional shape, or determination based on the range of calculating shape index values and similar parameters (for example widths of expansion of the range of correction 510, 511 and the like).

[2.5 Fitting Curved (Curved Surface)]

In the step 105' of FIG. 1B, curves or curved surfaces are fitted to groups of points within the range of correction set in the step 109 among the three-dimensional shapes (groups of three-dimensional points) of the objects measured in the step 102'. As this operation is identical to the step 105 in FIG. 1A, we omit the detailed description of the same.

[2.6 Correction of Shape]

In the step 110 of FIG. 1B, shapes are corrected based on the curves acquired in the step 105. The method of correction is basically identical with the step 106 in FIG. 1A, but it is different in that the correction is carried out based on the rule of correction method set out in the data base 108 in advance. In other words, curve parameters for determining the corrected shape can be obtained by using for example (Equation 1) and (Equation 2) from the shape index values, acquired in the step 103'. And the relationship equation for obtaining curve parameters of "Equation 1", "Equation 2" and the like is given by learning and the like in advance. The relationship equation mentioned above is often chosen by process conditions as required.

[3. Example of Making Good Use of High-precision Shape of Objects Obtained (Estimation of Distinctive Features of Semiconductor Devices)]

The high-precision measurement results of the shape of objects obtained by the procedure described above can be used for estimating the distinctive features of semiconductor devices and for controlling the manufacturing process of semiconductors. In other words, the monitoring of measured shapes highly correlated with the features of the device mentioned above enables to estimate the distinctive features of the device or to monitor changes in the distinctive features of the device.

As specific examples, we will take up and describe the gating process as an example of manufacturing process, the threshold value voltage of transistors as an example of the feature of devices for estimating or monitoring, and the footing part as a point of measurement of line patterns to be noted. FIGS. 10A to 10C show a measured shape 1001 whose shape at the footing part was corrected by the present invention. As there is an important correlation between the shape of the footing part and the threshold value voltage in the gating process and the like, it is useful and effective to estimate and monitor the threshold value voltage from the shape of the footing part mentioned above. In other words, once the thickness of the footing shape (for example 1009 or 1010) relative to the ground at any x coordinate as shown in FIG. 10A is known, the information is very useful in estimating the threshold value voltage, and a degree 1011 of roundness of the shape of footing can be expressed by curvature and the like.

In addition, FIGS. 10B and 10C show the cases of calculating the strength of features highly correlated with the threshold value voltages from the three-dimensional coordinates in the footing part. FIG. 10B is a graph showing a method of featuring the volume of roundness at the footing part, and the volume is expressed by the area 1006 enclosed by the surface of the measured shape 1001 and broken lines 1002 and 1003. The broken line 1002 linearly approximates the grounding part of the measured shape 1001 and extends the straight line, and the broken line 1003 linearly approximates the sidewall part of the measured shape 1001 near its center and extends its straight line. The points 1004 and 1005 are respectively the points at which the straight lines 1003 and 1002 and the measured shape 1001 separated each other.

Unlike the length of the footing part 1007 from the top-down observation image cited as an example of two-dimensional measurement, the addition and use of the volume 1006 that transforms the three-dimensional shape of footing into a feature value as the feature value of the shape of footing can be useful and effective for estimating and monitoring threshold value voltage.

And as shown in FIG. 10C, together with the range in the x direction 1007 of the footing part, the range in the z direction 1008 may be calculated and used as a feature value. FIG. 10A to 10C represent nothing more than some examples of methods of calculating the feature values from three-dimensional shapes (sectional shapes). The use of feature values to which the three-dimensional shape (sectional shape) of the object shape is added, however, enables to improve the precision of estimating threshold value voltage or the reliability of monitoring. The feature values (1006 to 1011 and the like) calculated from the coordinates of measured shape mentioned above and the measured shape described above will be referred to as "shape parameter."

Figure 11:
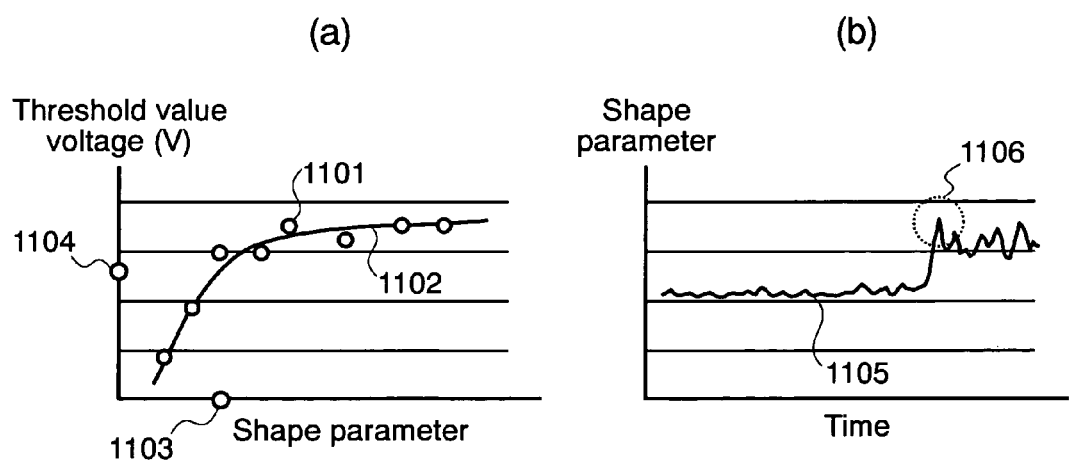
FIG. 11A is a graph showing the relationship between shape parameters and threshold voltage.
FIG. 11B is a graph showing chronological changes in the shape parameters.
Figure 12:
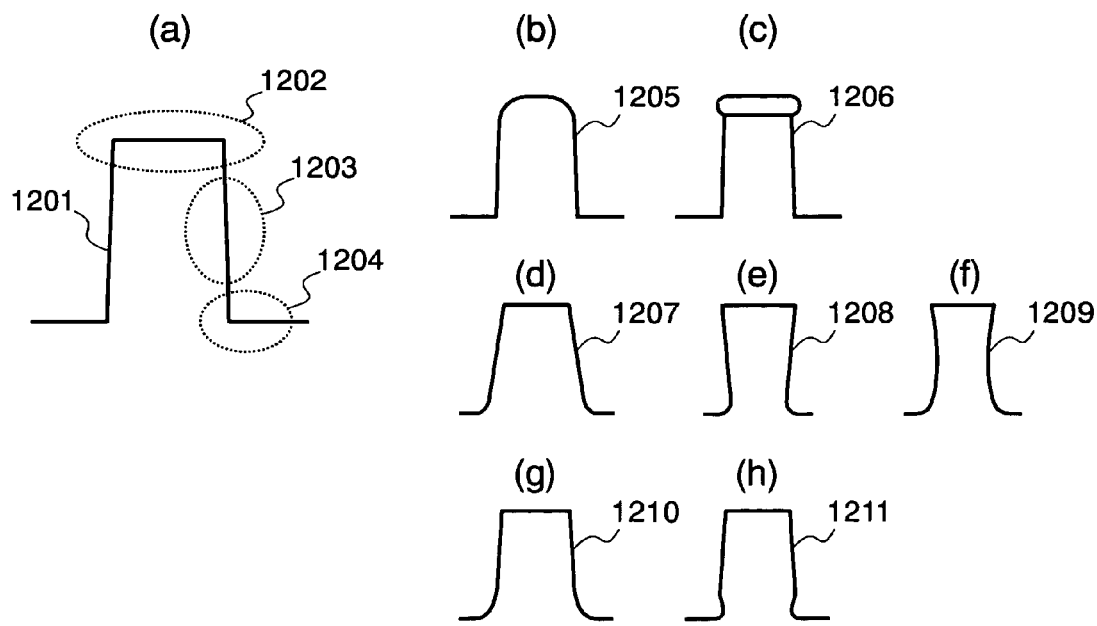
FIG. 12A is a graph showing the sectional shape of the pattern and the representative points of correction.
FIG. 12B is a graph showing the round shape of the top rounding for the sectional shape of the pattern.
FIG. 12C is a graph showing the T top shape protruding in the shape of T for the sectional shape of the pattern.
FIG. 12D is a tapered shape for the sectional shape of the pattern.
FIG. 12E is a graph showing a reverse tapered shape for the sectional shape of the pattern.
FIG. 12F is a graph showing a bowing shape bending back in the shape of a bow for the sectional shape of the pattern.
FIG. 12G is a graph showing the round shape of the footing for the sectional shape of the pattern.
FIG. 12H is a graph showing the notched shape at the bottom for the sectional shape of the pattern.

FIG. 11A shows an example of the method of estimating threshold value voltages. The learning of a relationship 1102 between the above-mentioned shape parameters and threshold value voltage enables to for example estimate threshold value voltage 1104 from shape parameters 1103. And the monitoring of changes 1105 in shape parameters as shown in FIG. 11B enables to detect anomalies of the process from big changes in shape parameters as shown in 1106. For proceeding to such a monitoring, it is not always necessary to estimate threshold value voltage. The estimation of device features or the monitoring of device features described in FIG. 11 is based on the use of a shape parameter. However, obviously plural types of shape parameters may be used for estimating device features or monitoring device features. And device features other than threshold value voltage can also be estimated.

[4. Variation in the Points of Correction and Shapes of Correction]

So far we have described the method of correcting and making good use of the footing shapes. However, the present invention also enables to carry out similar operations for other variations for the points of correction and the types of shape of correction shown in FIGS. 12A to 12H. FIG. 12A shows the representative points of correction in the sectional image of line patterns, and FIG. 12B to 12H show the representative types of correction shapes in the same way. As examples of points of correction of the sectional shape 1201 shown in FIG. 12A, we showed the general positions consisting of a top part 1202, a sidewall part 1203 and a bottom part 1204. As the shape types of the top part 1202, it is possible to cite the top-rounding shape 1205 shown in FIG. 12B, a T-top shape 1206 protruding in the T shape shown in FIG. 12C, as the shape types of the sidewall part 1203, a taper shape 1207 shown in FIG. 12D, a reverse taper shape 1208 shown in FIG. 12E, a bowing shape 1209 warping in the shape of bow shown in FIG. 12F are cited, and as the shape types at the bottom part 1204, a round footing shape 1210 shown in FIG. 12G, and a notched shape 1211 shown in FIG. 12H are cited. Of course, the present invention may be applied to semiconductor patterns other than such line patterns (for example, contact hole and the like).

[5. GUI]

Figure 13:
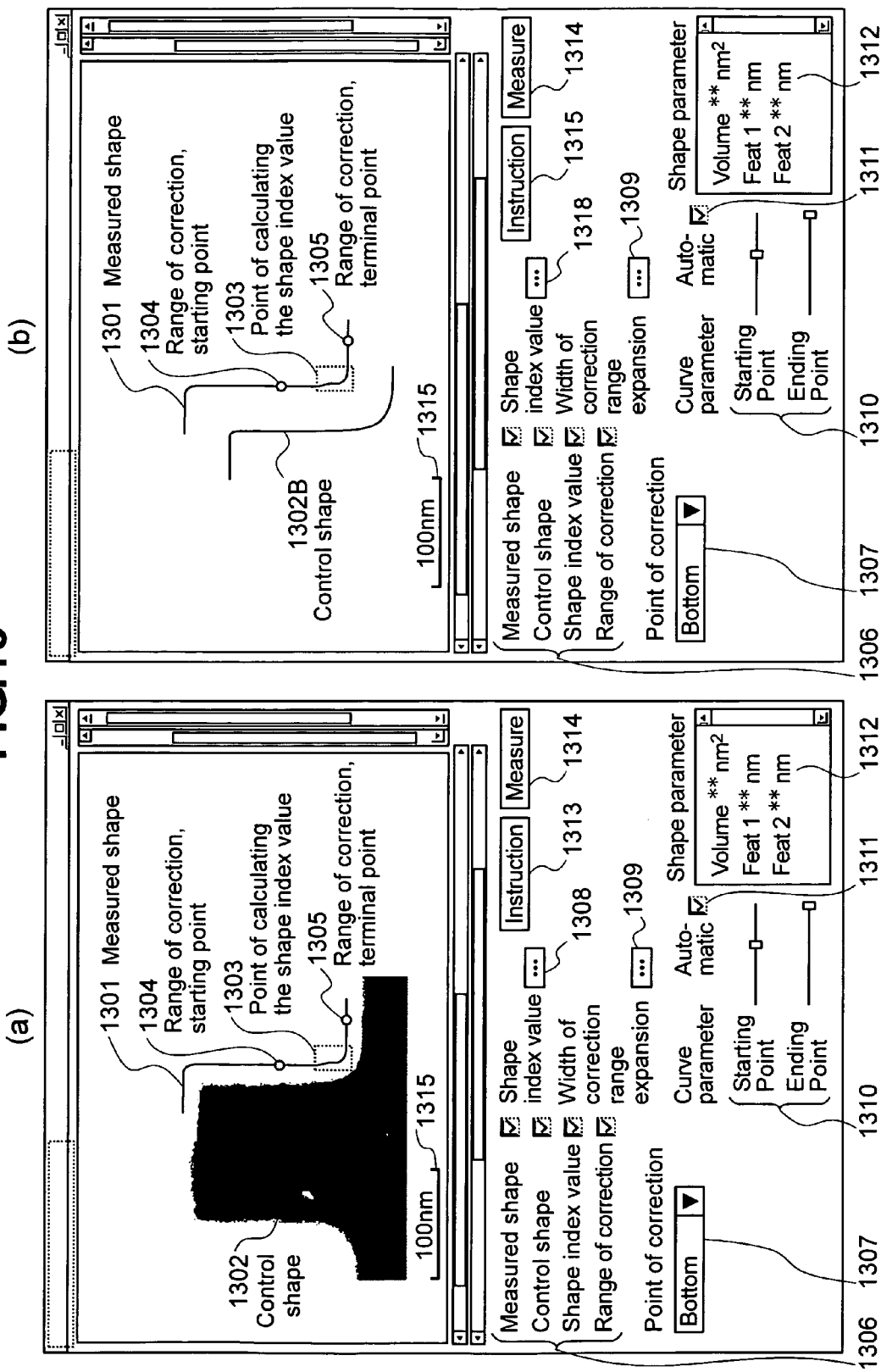
FIG. 13A is an example of GUI displaying the details of operation and the results of measurement and a graph showing the sectional shape of the measured points cut out by a FIB and the like as a control shape.
FIG. 13B is another example of GUI displaying the details of operation and the results of measurement and a graph showing the contour shape of the pattern measured by SPM an the like as a control shape.

FIG. 13 shows an example of GUI for displaying the details of operation and the results of measurement according to the present invention. We will describe below the representative display functions and the operating work on the GUI. The GUI according to the present invention includes a part of or the whole of the following display functions and operating works.

In order to correct and bring the measured shape 1301 (including corrected shape or corrected shape being adjusted) closer to the correct shape during learning, and to visualize the measurement errors of the measured results 1301 even at the time of measurement, a GUI capable of performing a comparative display of a measured shape 1301 and a control shape 1302 (side-by-side display or overlapping display of both) is effective, and examples of such displays are shown in FIGS. 13A and 13B. It is possible to display the measured shape 1301 and the control shape 1302 by moving them independently by means of a scroll bar and the like. With regard to the control shape, we have already explained in the note relating to the control shape 107 in FIGS. 1A and 1B. Specifically, FIG. 13A shows the sectional shape 1302 of a semiconductor pattern at the point of measurement cut off by means of a FIB and the like as a control shape. In addition, it is possible to display for example the three-dimensional shape of a semiconductor pattern measured by means of SPM and the like (outline shape of a pattern 1302B) as shown in FIG. 13B. And at the time of display, it has a function of displaying at the same time the data acquisition multiplication of the measured shape 1301 and the control shapes 1302 and 1302B and the function of displaying display dimensions 1315.

The calculation range of the shape index value calculated in the step 103 can be displayed as shown by 1303. If the shape index value is given within any range in the image (for example 413 in FIGS. 4A and 4B), the range can be shown, and if the shape index value is equivalent to the feature value at any single point in the image, the point can be displayed. And the value of the shape index value (including the value of index value and the range of calculation) can be displayed by 1308. Of course, when plural shape index values are contained in the display of the shape index values, a part of or all of them can be displayed.

The correction range of measured shape can be displayed. FIGS. 13A and 13B shows for example a starting point 1304 and an ending point 1305 of the range of correction. And various parameters and the like for setting the range of correction can be specified or displayed. For example, the width of expansion of the correction range is displayed by 1309. The display of the above-mentioned measured shape 1301, the control shape 1302 and 1302B, the shape index value 1303, and the display of the range of correction 1304 and 1305 can be switched ON and OFF by means of a check box 1306. And the range of calculation, volume and the like of the shape parameters shown by 1006-1011 in FIG. 10 can be graphically displayed along with the display of the measured shape 1301 and the control shapes 1302 and 1302B.

The correction points and the shape types of measured shape can be selected for example by means of a pull-down menu 1307. The correction points and the shape types that may be selected by means of the pull-down menu 1307 include the variations shown in FIG. 12 for example. And depending on the correction points or the shape types chosen by the pull-down menu 1307, the operation details such as the method of calculating shape index values and the method of setting the correction range can be automatically changed at the time of measuring. For example, when it is necessary to change the details of the operation during the correction of the top part 1202 and the bottom part 1204, the switch over may be automatically made internally. Even if the matter concern only the bottom part, when the details of the operation are different between the case of correcting the round shape 1210 of footing and the case of correcting notch shape 1211, the switch over can automatically be performed internally in the same manner. And, for example when the bottom part 1204 is chosen as the point of correction, the type of shape of the bottom part (whether the footing is round, or if a notch has developed, and the like) can be automatically estimated based on any shape index value, and the details of the operation mentioned above can be automatically changed depending on the type of shape mentioned above. When it is difficult to automatically render such a judgment of the shape type, the shape type can be designated by means of the pull-down menu 1307.

The curve parameters to be adjusted in the correction of measured shape in the step 106 can be inputted in the form of value or designated by means of a slider. FIG. 13A shows a slider 1310 for adjusting the strength of tangent vectors at the starting point and the ending point of the curve as an example. The number of curve parameters to be adjusted differs depending on the correction method, and the number of input objects such as slider and the like displayed on the GUI increases or decreases in response to the number of curve parameters to be adjusted mentioned above. In addition, an adjustment of the slider 1310 for example results in a change in the measured shape 1301 keeping pace with the adjustment work mentioned above and enables to display the corrected shape corresponding to the adjusted value mentioned above.

A part of or the whole learning operation may be automated by using the control shape (1302, 1302B and the like). In other words, the conditions for which the degree of agreement between the control shapes and the corrected shapes is the highest (a part or the whole of correction range, the curve parameters or the like) can be automatically searched. When, for example, the total sum of the distances from each point of the corrected shape to the control shape is taken as an evaluation function, the degree of agreement is given by the reciprocal number of the above-mentioned evaluation function used when the corrected shape and the control shape are matched in such a way that the evaluation function may be the minimum. And when the control shape is like the sectional image 1302, the extraction of outline by the operation of detecting edge can facilitate the matching with the measured shape 1301. The above-mentioned automation function may be switched ON and OFF by using the check box 1311.

The box 1312 can display some or all of various shape parameters. The example of the shape parameter is as described for the shape parameters 1006 to 1011 shown in FIGS. 10A to 10C.

A push on the teaching button 1313 results in various parameters set by 1307 to 1311 being learnt. A push on the measuring button 1314, on the contrary, results in correction operation being undertaken based on the details of operations and operating parameters stored in the data base 108.

And graphs showing the relationship between any shape index value and curve parameters at the time of learning shown in FIGS. 9A to 9C, or the relationship between the shape parameters and device features respectively shown in FIGS. 11A and 11B and time-series changes in shape parameters can be displayed on the GUI. The indication of the above-mentioned relationships in FIGS. 9A and 9C and FIG. 11A enables to grasp the state of learning and to judge whether the learning should be continued or terminated. And the distribution of shape index values, shape parameters or device features in various learning samples plotted in the figure enables to visualize the differences in the trend of distribution for each process information, and the differences in such trend enable to judge individual what learning should be undertaken separately in which process information.

Figure 14:
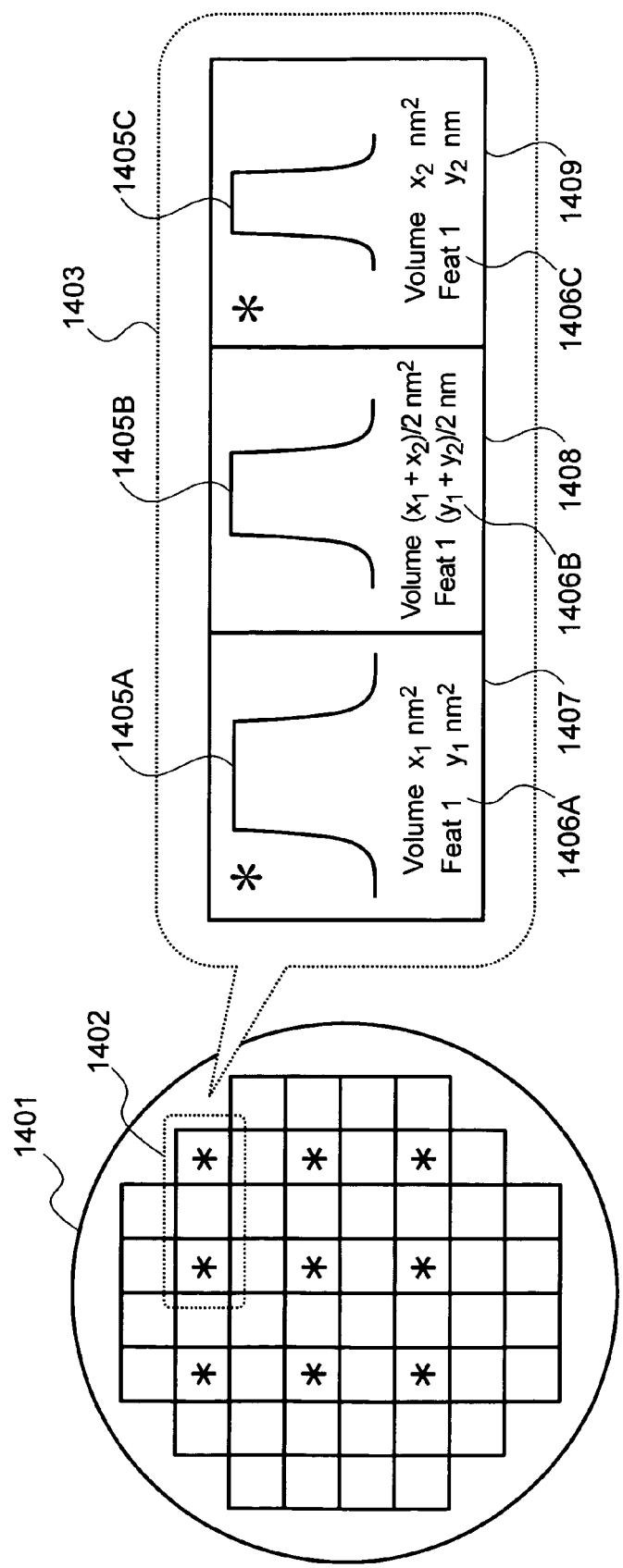
FIG. 14 is an illustration showing a GUI displaying the distribution on the wafer surface of the measured results.

FIG. 14 is a GUI showing the distribution of various information such as measured shapes (including ones before and after correction), shape index values, shape parameters and the like within the surface of the semiconductor wafer 1401. In other words, in order to grasp the distribution of various information mentioned above on the surface of a semiconductor wafer, various information mentioned above can be arranged and displayed. A display 1403 is an enlargement of apart of a display 1402. Chips 1407 and 1409 can respectively display various information such as measured shapes 1405A and 1405C respectively measured, shape index values and shape parameters 1406A, 1406B and the like. And in 1401 the mark * represents a measured chip and chips deprived of the mark * indicates schematically that no measurement has been made. In the present example, the chip 1408 was not measured. However, even for the chip wherein no such measurement has been made, it is possible to estimate the measurement result based on various information obtained from the measured chips available in the surrounding area (for example chips 1407 and 1409) and display the same.

The invention may be embodied in other specific forms without departing from the spirit or essential features thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method for measuring a shape of a semiconductor pattern on a semiconductor wafer in a scanning electron microscopy (SEM) apparatus including an electro-optical system to irradiate electron beams onto the semiconductor wafer, the method comprising:

acquiring a tilt image of the semiconductor pattern on the semiconductor wafer by observing the semiconductor pattern by scanning the electron beams onto the semiconductor wafer, via the electro-optical system;

estimating a sectional shape of the semiconductor pattern from the acquired image of the semiconductor pattern, the sectional shape being a three-dimensional (3D) shape;

calculating a shape index value correlated with the estimated sectional shape of the semiconductor pattern;

determining a range of a correction area in the estimated sectional shape of the semiconductor pattern by segmenting an area of the estimated sectional shape using information of the calculated shape index value;

fitting a curve or a curved surface to a bottom corner of the estimated sectional shape within the range of the correction area in the estimated sectional shape; and correcting the estimated sectional shape of the semiconductor pattern from the acquired image based on the curve or curved surface fitted to the bottom corner of the estimated sectional shape within the range of the correction area.

2. The method according to claim 1, wherein information on a degree of roundness of a bottom footing shape at a bottom of the semiconductor pattern is obtained from the corrected sectional shape of the semiconductor pattern.

3. A method for measuring a shape of a semiconductor pattern on a semiconductor wafer in a scanning electron microscopy (SEM) apparatus including an electro-optical system to irradiate electron beams onto the semiconductor wafer, the method comprising the steps of:

acquiring an image of the semiconductor pattern on the semiconductor wafer by observing the semiconductor pattern by scanning the electron beams onto the semiconductor wafer, via the electro-optical system;

estimating a three-dimensional (3D) shape of the semiconductor pattern from the acquired image of the semiconductor pattern;

segmenting an area for correcting the estimated 3D shape;

determining a curve or a curved surface to be fitted to the acquired shape; and comparing the estimated shape with a control shape stored in advance and correcting the estimated 3D shape, wherein in the step of determining, the curve or curved surface is fitted to the estimated 3D shape of the semiconductor pattern within the area segmented at the step of segmenting; and wherein the estimated 3D shape is corrected by using the determined curve or curved surface by adjusting parameters of an equation of the determined curve or curved surface.

4. The method according to claim 3, wherein the estimated 3D shape and the control shape stored in advance are arranged side by side on a display screen for a user interface.

5. The method according to claim 3, wherein information on a degree of roundness of a bottom footing shape at a bottom of the semiconductor pattern is obtained from the corrected 3D shape of the semiconductor pattern.

6. An apparatus for measuring a shape of a semiconductor pattern on a semiconductor wafer, comprising:

SEM image acquiring means for acquiring tilt images of the semiconductor pattern on the semiconductor wafer;

image processing means for processing the tilt images acquired by the SEM image acquiring means, for estimating a sectional three-dimensional (3D) shape of the semiconductor pattern from the tilt images of the semiconductor pattern, for calculating shape index values correlated with the estimated sectional 3D shape of the semiconductor pattern, for determining a range of a correction area in the estimated sectional 3D shape by segmenting an area of the estimated sectional 3D shape using information of the calculated shape index values, and for fitting a curve or a curved surface to a bottom corner of the estimated sectional 3D shape;

shape correcting means for correcting the estimated sectional 3D shape of the semiconductor pattern within the determined range of the correction area based on the curve or curved surface fitted to the bottom corner of the estimated sectional 3D shape within the range of the correction area; and display means for displaying the corrected sectional 3D shape of the semiconductor pattern corrected by the shape correcting means.

7. The apparatus according to claim 6, further comprising storing means for storing shape information of the semiconductor pattern acquired by measuring the semiconductor pattern in advance, wherein the display means displays the shape information of the semiconductor pattern stored in the storing means and the corrected sectional 3D shape of the semiconductor pattern corrected by the shape correcting means, both of which are arranged side by side on the display means.

8. An apparatus for measuring a shape of a specimen on a semiconductor wafer, comprising:

an electro-optical system arranged to obtain a tilt image of the specimen on the semiconductor wafer by scanning electron microscopy (SEM); and an image processing unit arranged to estimate a sectional three-dimensional (3D) shape of the specimen from the tilt image obtained from the specimen, to calculate a shape index value correlated with the estimated sectional 3D shape of the specimen, to determine a range of a correction area in the estimated sectional 3D shape of the specimen by segmenting an area of the estimated sectional 3D shape using information of the calculated shape index value, to fit a curve or a curved surface to a bottom of the estimated sectional 3D shape within the range of the correction area in the estimated sectional shape, and to correct the estimated sectional 3D shape of the specimen based on the curve or curved surface fitted to the bottom of the estimated sectional 3D shape within the range of the correction area.

9. The apparatus according to claim 8, wherein the image processing unit further comprises:

a database to store shape information of the specimen in advance; and a display unit to provide a visual display of the shape information of the specimen stored in the database and the corrected sectional 3D shape of the specimen, side-by-side via a user interface.

* * * * *